(12) United States Patent
Mori (10) Patent No.: US 7,816,752 B2
(45) Date of Patent: Oct. 19, 2010

(54) SOLID STATE IMAGING DEVICE AND CAMERA COMPRISING A DEVICE ISOLATION HAVING A STEP

(75) Inventor: Mitsuyoshi Mori, Kyoto (JP)

(73) Assignee: Panasonic Corporation, Osaka (JP)

( * ) Notice: Subject to any disclaimer, the term of this patent is extended or adjusted under 35 U.S.C. 154(b) by 705 days.

(21) Appl. No.: 11/436,649

(22) Filed: May 19, 2006

(65) Prior Publication Data

US 2006/0273359 A1  Dec. 7, 2006

(30) Foreign Application Priority Data

Jun. 7, 2005 (JP) .............................. 2005-166792

(51) Int. Cl.
H01L 33/133 (2006.01)
(52) U.S. Cl. ..................... 257/446; 257/291; 257/292; 257/E27.133
(58) Field of Classification Search ................ 257/291, 257/292, 446, E27.133; H01L 33/113
See application file for complete search history.

(56) References Cited

U.S. PATENT DOCUMENTS 6,140,156 A * 10/2000 Tsai .......................... 438/148
7,199,411 B2 4/2007 Yoshida et al.
2004/0251481 A1* 12/2004 Rhodes ........................ 257/292
2005/0139943 A1* 6/2005 Kanbe ......................... 257/431

FOREIGN PATENT DOCUMENTS

CN 1591888 A 3/2005
JP 2004-039832 A 2/2004

OTHER PUBLICATIONS

Claim recitation for U.S. Appl. No. 11/826,570, filed Jul. 17, 2007 and presently pending as of Mar. 16, 2009.*
Chinese Office Action, w/ English translation thereof, issued in Chinese Patent Application No. CN 200610073224.0 dated Apr. 3, 2009.

* cited by examiner

Primary Examiner—Leonardo Andújar
Assistant Examiner—Christopher M Roland
(74) Attorney, Agent, or Firm—McDermott Will & Emery LLP (57) ABSTRACT

In a solid state imaging device which includes a photodiode in the upper part of a silicon substrate and a MOSFET active region separated from the photodiode by a device isolation region, the width of the device isolation region is smaller in its lower part than in its upper part.

9 Claims, 9 Drawing Sheets

SOLID STATE IMAGING DEVICE AND CAMERA COMPRISING A DEVICE ISOLATION HAVING A STEP

BACKGROUND OF THE INVENTION

The present invention relates to a solid state imaging device including an imaging region which has a plurality of pixels over a semiconductor substrate, a camera, and a method for fabricating a solid state imaging device.

A MOS (Metal Oxide Semiconductor) solid state imaging device is an image sensor wherein a signal accumulated in a photodiode which constitutes a corresponding pixel is read by an amplification circuit which includes a MOS transistor. The MOS solid state imaging device is advantageously capable of low voltage operation and high-speed charge reading and can be integrated with peripheral circuits into one chip.

Thus, the MOS solid state imaging devices have been receiving attentions as to the uses in small cameras for personal computers and portable devices, such as mobile phones. In recent years, in the MOS solid state imaging devices, reduction in cell size and improvement in sensitivity have been especially demanded.

Figure 8:
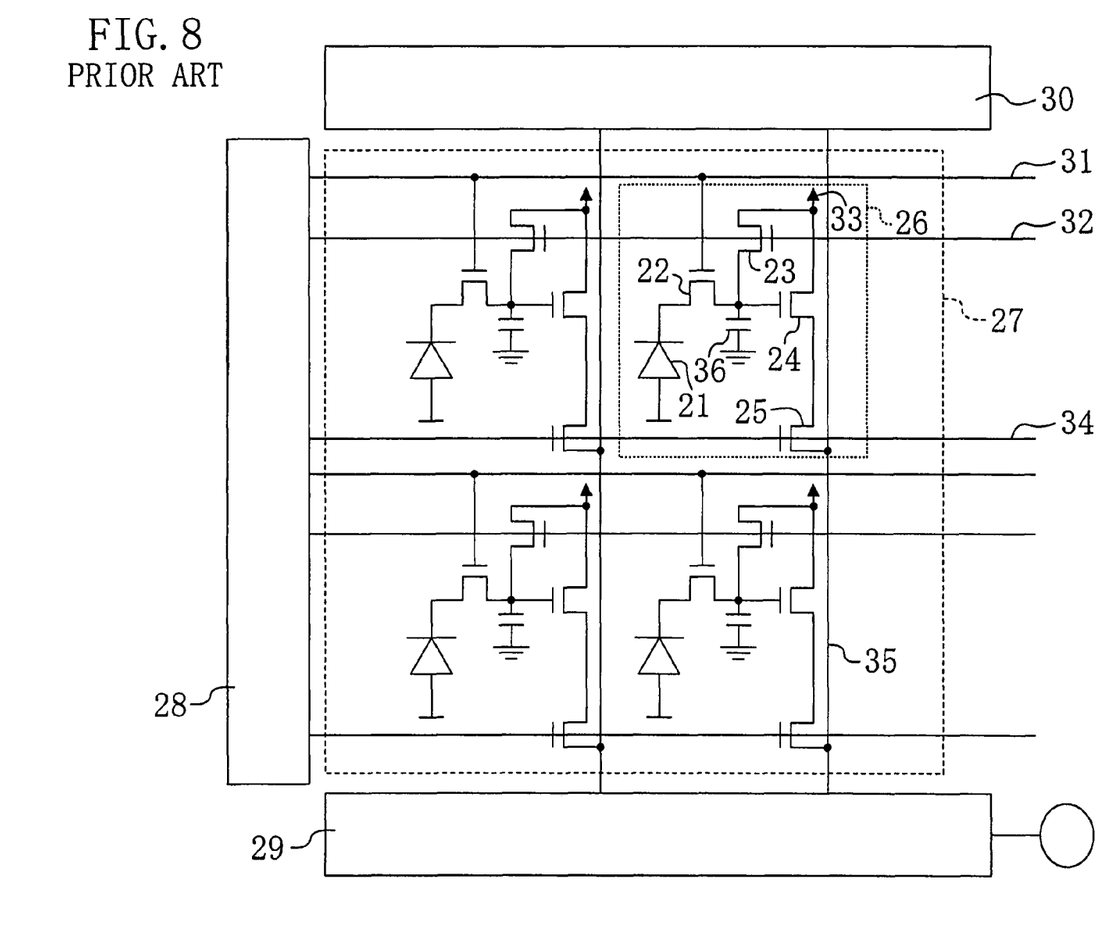
FIG. 8 is a circuit diagram showing an example of a circuit structure of a generally-employed MOS solid state imaging device.

FIG. 8 is a circuit diagram showing an example of a circuit structure of a generally-employed MOS solid state imaging device. It should be noted that the circuit structure shown in FIG. 8 is applicable not only to a conventional solid state imaging device but also to a solid state imaging device of the present invention. Referring to FIG. 8, the generally-employed MOS solid state imaging device includes, on one substrate, an imaging region 27 in which a plurality of pixels 26 are arranged in a matrix, a vertical shift register 28 and horizontal shift register 29 for selecting the pixels, a timing generation circuit 30 for supplying necessary pulses to the vertical shift register 28 and horizontal shift register 29.

Each of the pixels 26 arranged over the imaging region 27 is formed by a photodiode region 21 for photoelectric conversion and a MOS transistor accompanying thereto. Electric charges accumulated in the photodiode region 21 are transferred by a transfer transistor 22 to a floating diffusion section 36. The drain of the floating diffusion section 36 also serves as the source of a reset transistor 23 which is connected to a power supply 33. The gate of an amplification transistor 24 is connected to the floating diffusion section 36, and the drain of the amplification transistor 24 is connected to the power supply 33. The source of the amplification transistor 24 is connected to the drain of a selection transistor 25. The source of the selection transistor 25 is connected to an output pulse line 35.

The gate of the transfer transistor 22, the gate of the reset transistor 23, and the gate of the selection transistor 25 are respectively connected to output pulse lines 31, 32, and 34 extending from the vertical shift register 28.

The MOS solid state imaging device includes a device isolation region for isolating the photodiode region 21 and corresponding MOS transistor formed on the semiconductor substrate. The device isolation region includes LOCOS (Local Oxidation of Silicon), which is a thermal oxidation film in general. However, when LOCOS is used, it is necessary to extend the width of the device isolation region in order to achieve a desired device separation characteristic. Further, since the formation of LOCOS causes a bird's beak, it is necessary to secure a sufficient width for an active region. Accordingly, it is necessary to increase the area of the device isolation region for one pixel and the area of the active region for one pixel. Thus, it is difficult to reduce the cell size.

Figure 9:
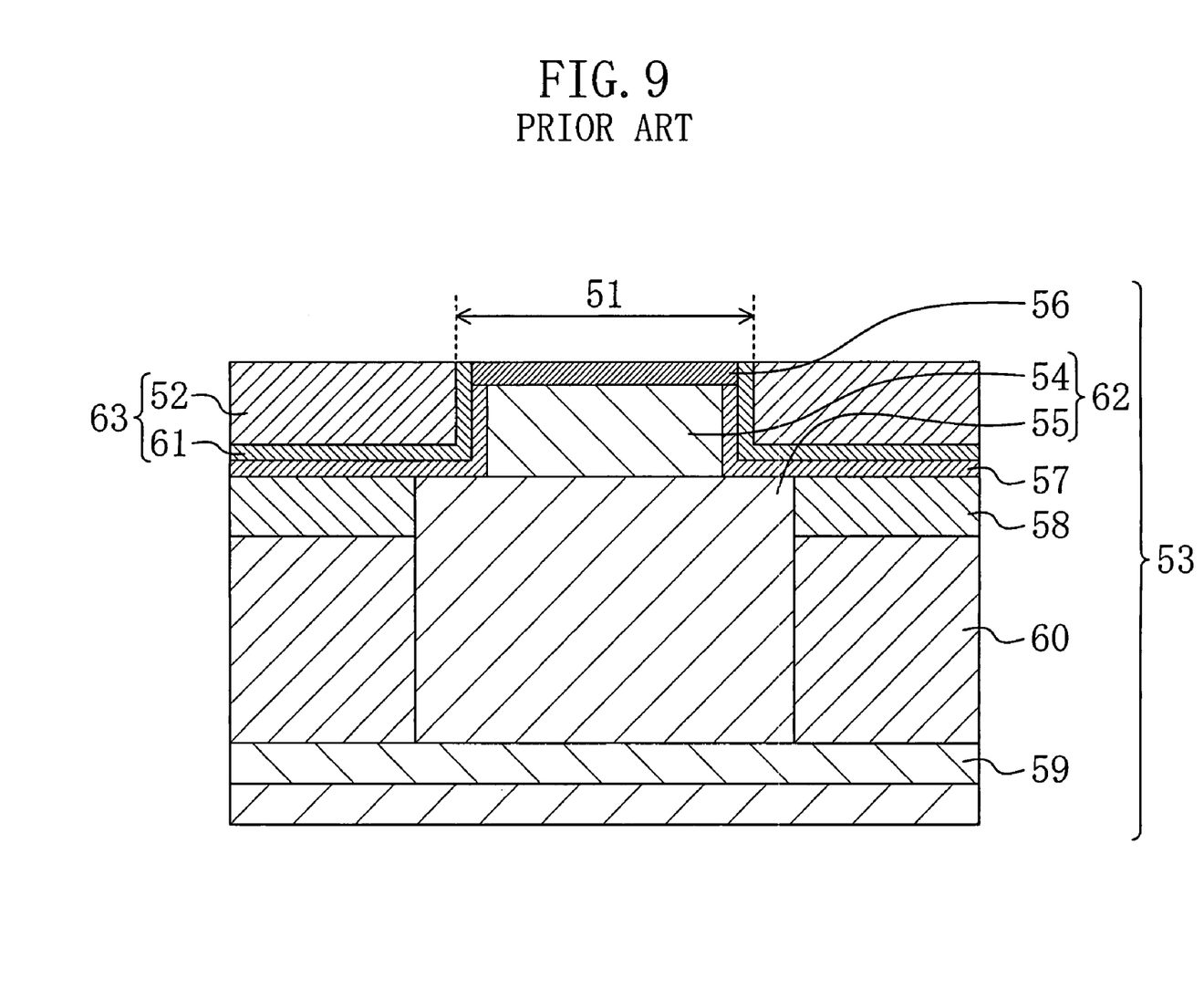
FIG. 9 is a cross-sectional view showing a structure of a photodiode region in a conventional solid state imaging device.

A countermeasure against the above-described problem is a conventional technique disclosed in Japanese Laid-Open Patent Publication No. 2004-39832, which is described below. FIG. 9 is a cross-sectional view showing the structure of a photodiode region in a conventional solid state imaging device.

As shown in FIG. 9, the uppermost level of a silicon substrate 53 is a thin $P^+$ silicon layer 56 for preventing leakage of electric charges from its surface. Provided under the $P^+$ silicon layer 56 is a photodiode 62 which includes an N-type silicon layer (signal charge accumulation region) 54 and a $P^-$ silicon layer 55 provided under the N-type silicon layer 54.

A device isolation region 63 is provided around the photodiode 62 at the top (i.e., upper) surface of the silicon substrate 53. The device isolation region 63 extends from the top surface of the silicon substrate 53 to a depth substantially equal to the lower surface of the N-type silicon layer 54. The device isolation region 63 has a STI (Shallow Trench Isolation) structure. The device isolation region includes a silicon oxide ($SiO_2$) film 61 which covers the inner surface of the well and an insulating film 52 of $SiO_2$, or the like, which is provided over the silicon oxide film 61 to fill the well. With this structure, at the top surface of the silicon substrate 53, the photodiode 62 is electrically isolated from neighboring devices.

A portion of the silicon substrate 53 which is in contact with the bottom of the photodiode 62 is a P-type deep well 59. The $P^+$ silicon layer 56 and the P-type deep well 59 are electrically connected through a $P^+$ channel stopper layer 57 which covers the side and bottom surfaces of the device isolation region 63 and a P-type surface well 58 and P-type plug well 60 which are provided under the $P^+$ channel stopper layer 57. With this structure, the N-type signal charge accumulation region (the N-type silicon layer 54) is also electrically isolated from the neighboring devices in the silicon substrate 53. Thus, in this structure, leakage of signal charges is small.

When light impinging on a light receiving region 51 of the photodiode 62 (a portion of the silicon substrate 53 which is surrounded by the device isolation region 63) reaches a PN junction of the N-type silicon layer 54 and the $P^+$ silicon layer 56 or $P^-$ silicon layer 55, the light is converted to holes and electrons, and signal charges (electrons) which are determined according to the amount of the impinging light are accumulated in the N-type silicon layer (signal charge accumulation region) 54.

In this conventional example, the device isolation region 63 has a STI structure, and therefore, no bird's beak occurs, and the device isolation region does not extend into the light receiving region 51. Therefore, it is not necessary to secure a sufficient width for the active region of the MOS transistor. Accordingly, reduction in area of the light receiving region 51 is prevented, so that a large area can be secured for the light receiving region 51. In the device isolation region 63 of the STI structure, the width of the insulating material necessary for device isolation is narrow as compared with the LOCOS structure, and the like. Therefore, in the case of employing the STI structure as a device isolation, the area of the device isolation structure itself is reduced. Accordingly, the sensitivity of the photodiode is improved, and the size of one pixel is decreased.

However, in the above-described conventional example, a portion of the silicon substrate 53 which covers the side and bottom surfaces of the device isolation region 63 is a $P^+$ channel stopper layer 57 which is formed by ion implantation. Therefore, in thermal processes for fabrication of the MOS solid state imaging device, the $P^+$ channel stopper layer 57 extends so that the N-type silicon layer 54 in which photoelectrically-converted charges are to be accumulated is diminished. Especially in a solid state imaging device having a cell size of 3 µm or less, the dynamic range greatly decreases for the above causes.

When forming the device isolation region of the STI structure, an edge portion at the bottom of the device isolation region 63 locally has tensile stress in the silicon substrate 53. Around the bottom of the device isolation region 63 is the N-type silicon layer 54 in which charges are to be accumulated. In addition to the photoelectrically-converted charges, charges resulting from defects generated by the stress are also accumulated in the N-type silicon layer 54 (the signal charge accumulation region of the photodiode). That is, in addition to the charges generated when light impinges on the light receiving region, unnecessary charges are generated even when light does not impinge on the light receiving region, and the generated unnecessary charges are accumulated in the N-type silicon layer 54. These charges cause a variation of characteristics between pixels and a white blemish (white point) which occurs when there is no impinging light. As a result, the sensitivity of the photodiode deteriorates.

SUMMARY OF THE INVENTION

The present invention was conceived for the purpose of solving the above problems. An objective of the present invention is to realize a solid state imaging device, camera, and solid state imaging device fabrication method wherein an N-type silicon layer is secured as a charge accumulation region such that the decrease of the dynamic range is prevented, and occurrence of random noise and white blemishes which would result from charges generated due to stress is prevented.

To achieve the above objective, a solid state imaging device according to the first aspect of the present invention includes: an imaging region provided in an upper part of a silicon substrate, the imaging region including a photoelectric conversion region; a device isolation at least partially surrounding the photoelectric conversion region, the width of the device isolation is smaller in its lower part than in its upper part; and a MOS transistor provided in the imaging region, the MOS transistor being electrically separated from the photoelectric conversion region by the device isolation.

In the solid state imaging device according to the first aspect of the present invention, the photoelectric conversion region is wide in a region neighboring the lower part of the device isolation as compared with conventional devices. As a result, the charge accumulation layer of the photoelectric conversion region is secured wide. Thus, the amount of accumulable charges can be increased even when the cell size is small. Further, the bottom edge of the device isolation is located away from the photoelectric conversion region. At this bottom edge, a large tensile stress locally occurs, and therefore, unnecessary charges which would cause noise are likely to be generated. However, the bottom edge is located spatially away from the photoelectric conversion region with an electric barrier provided therebetween, whereby noise is reduced.

A solid state imaging device fabrication method according to the second aspect of the present invention includes the steps of: (a) patterning a silicon nitride film formed on a silicon substrate to form an opening in the silicon nitride film; (b) forming a side wall on at least one of side surfaces of the opening of the silicon nitride film; (c) after step (b), performing an etching using the silicon nitride film and the side wall as masks to form an upper part of a device isolation trench in the silicon substrate; (d) after step (c), removing the side wall; and (e) after step (d), performing an etching using the silicon nitride film as a mask to form a lower part of the device isolation trench in the silicon substrate, the width of the lower part of the device isolation trench being smaller than the width of the upper part of the device isolation trench.

A solid state imaging device fabrication method according to the third aspect of the present invention includes the steps of: (a) patterning a silicon nitride film formed on a silicon substrate to form an opening in the silicon nitride film; and (b) performing an etching with a gas containing hydrogen bromide using the silicon nitride film as a mask to form a device isolation trench in the silicon substrate, the width of the device isolation trench is smaller in its lower part than in its upper part.

According to the present invention, in solid state imaging devices fabricated based on the above-described fabrication methods, the width of the device isolation is smaller in its lower part than in its upper part.

With the above structure, the photoelectric conversion region is wide in a region neighboring the lower part of the device isolation as compared with conventional devices. As a result, the charge accumulation layer of the photoelectric conversion region is secured wide. Thus, the amount of accumulable charges can be increased even when the cell size is small. Further, the bottom edge of the device isolation is located away from the photoelectric conversion region. At this bottom edge, a large tensile stress locally occurs, and therefore, unnecessary charges which would cause noise are likely to be generated. However, the bottom edge is located spatially away from the photoelectric conversion region with an electric barrier provided therebetween, whereby noise is reduced.

DESCRIPTION OF THE PREFERRED EMBODIMENTS

Embodiment 1

Hereinafter, a solid state imaging device and a fabrication method thereof according to embodiment 1 of the present invention are described with reference to the drawings.

Figure 1:
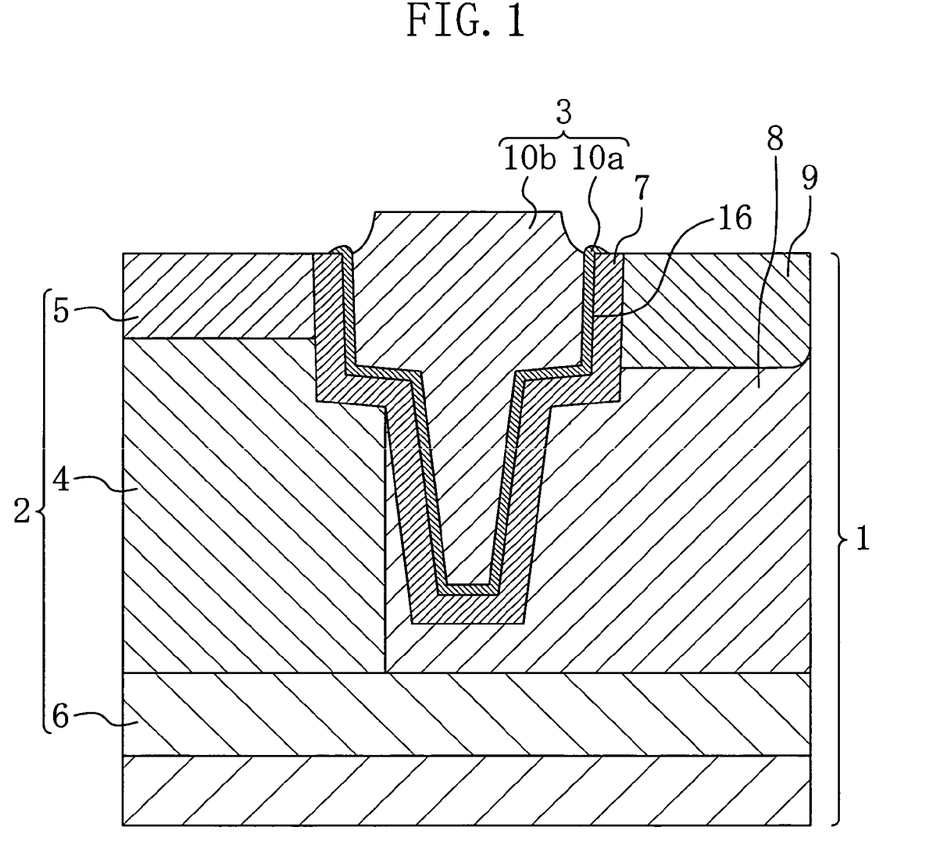
FIG. 1 is a cross-sectional view showing a structure of a solid state imaging device according to embodiment 1 of the present invention.

FIG. 1 is a cross-sectional view showing a structure of a solid state imaging device according to embodiment 1 of the present invention. It should be noted that wirings and interlayer films formed in a silicon substrate 1 are not shown. According to embodiment 1, as shown in FIG. 1, a photodiode (photoelectric conversion region) 2 has a $P^+NP^-$ structure in the upper part of the silicon substrate 1. Specifically, the $P^+NP^-$ structure includes a thin $P^+$ surface layer 5 provided at the uppermost level of the silicon substrate 1, an N-type silicon layer (charge accumulation region) 4 provided under the $P^+$ surface layer 5, and a $P^-$ silicon layer 6 provided under the N-type silicon layer 4.

When light impinging on the photodiode 2 reaches a PN junction interface between the N-type silicon layer 4 and the $P^+$ surface layer 5 or $P^-$ silicon layer 6, the light is photoelectrically converted to holes and electrons. Thus, signal charges (electrons) are accumulated in a depletion layer region between the N-type silicon layer 4 and the $P^+$ surface layer 5 and a depletion layer region between the N-type silicon layer 4 and the $P^-$ silicon layer 6 according to the amount of the impinging light. With the $P^+$ surface layer 5 provided at the uppermost level, charges which are generated due to random noise in the surface of the photodiode 2 are reduced.

The side of the photodiode 2 is at least partially covered by the device isolation region 3. The device isolation region 3 has a stepped shape where the width becomes smaller in a downward direction. In other words, the width of the device isolation region 3 changes ungradually from its upper part to its lower part. The device isolation region 3 has a side wall oxide film 10a which is formed by thermally oxidizing the surface of a stepped trench 16 and an insulating film 10b which is provided over the side wall oxide film 10a to fill the stepped trench 16. The device isolation region 3 electrically separates the photodiode 2 from an active region (source and drain regions) 9 of a MOS transistor which is used for reading accumulated charges. Specific examples of this MOS transistor are the MOS transistors 22, 23, 24 and 25 of FIG. 8.

In the structure shown in FIG. 1, a portion of the silicon substrate 1 which covers the side and bottom surfaces of the device isolation region 3 is a $P^+$ side wall layer 7 whose conductivity type is opposite to that of the active region of the MOS transistor. The $P^+$ side wall layer 7 is in contact with the side surface of the N-type silicon layer (charge accumulation region) 4. The $P^+$ side wall layer 7 electrically connects the $P^+$ surface layer 5 and a P-type silicon layer 8. The $P^+$ side wall layer 7 prevents unnecessary charges generated in the vicinity of the interface between the $P^+$ side wall layer 7 and the device isolation region 3 (which would cause noise) from flowing into the N-type silicon layer 4.

Next, a method for fabricating a solid state imaging device according to embodiment 1 is described with reference to the drawings. FIG. 2A through FIG. 2D and FIG. 3A through FIG. 3C are cross-sectional views showing fabrication steps of the solid state imaging device according to embodiment 1.

Figure 2A:
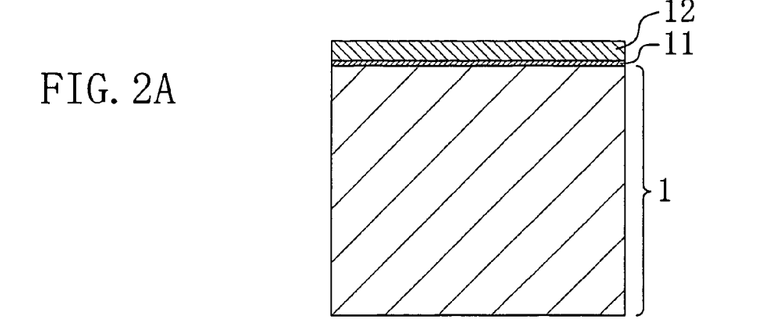
FIG. 2A through FIG. 2D are cross-sectional views showing fabrication steps of the solid state imaging device according to embodiment 1.

According to the fabrication method of embodiment 1, at the step shown in FIG. 2A, a pad insulating film 11 is formed of a silicon oxide film having a thickness of about 1 nm to 50 nm on the silicon substrate 1. On the pad insulating film 11, an anti-oxidization film 12 is formed of a silicon nitride film, or the like, having a thickness of 50 nm to 400 nm. On the anti-oxidization film 12, a resist layer (not shown) having an opening in a predetermined region is formed.

Figure 2B:
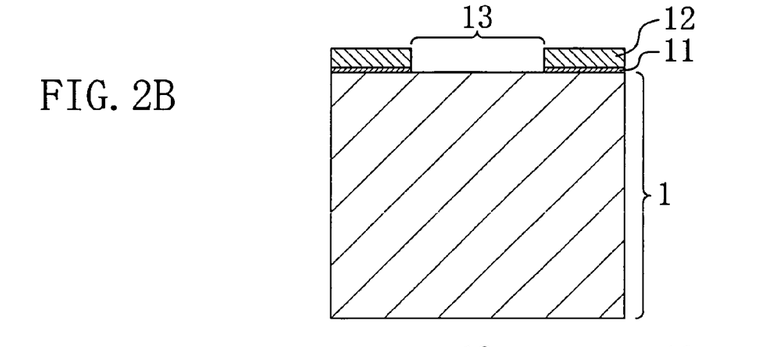

Then, at the step of FIG. 2B, etching is carried out using the resist layer as a mask to selectively remove the pad insulating film 11 and the anti-oxidization film 12, thereby forming an opening 13 through which the upper surface of the silicon substrate 1 is exposed. Thereafter, the resist layer is removed. The width of the opening 13 is about 0.13 μm to 30.0 μm.

Figure 2C:
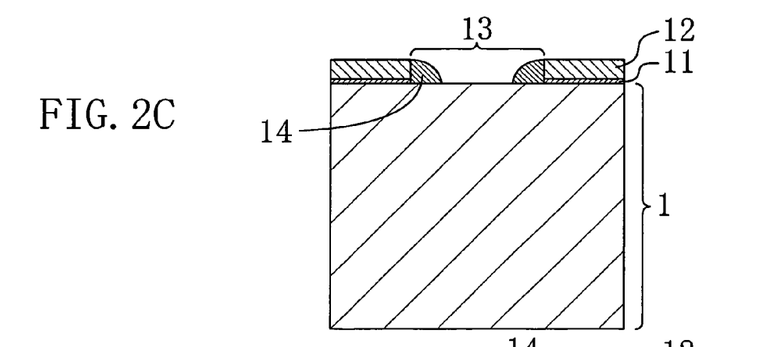

Then, at the step of FIG. 2C, an oxide film (not shown) is formed in the opening 13 so as to have a thickness of about 10 nm to 300 nm, and etching is carried out to form side walls 14 on the side surfaces of the opening 13. The width at the lower end of a device isolation region 3 (shown in FIG. 3C) which is to be formed later is determined according to the width of the side walls 14. Therefore, the width of the side walls 14 is adjusted such that the width at the lower end of the device isolation region 3 (shown in FIG. 1 or other drawings) satisfies the electric characteristics, low-noise characteristics, and wide dynamic range characteristics.

Figure 2D:
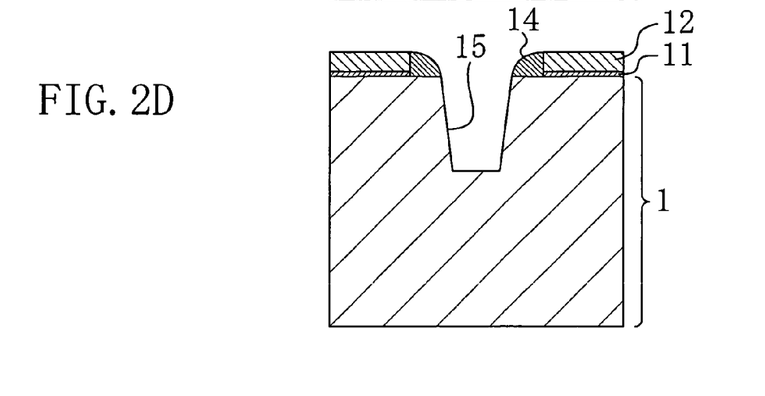

Then, the step of FIG. 2D is a trench formation step wherein the silicon substrate 1 is selectively etched using the anti-oxidization film 12 and the side walls 14 as masks to form a trench 15. The depth of the trench 15 is 10 nm to 400 nm.

Figure 3A:
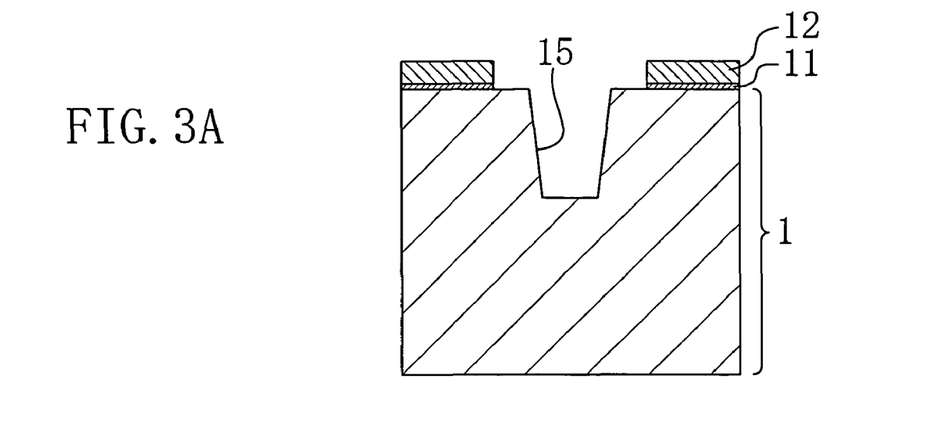
FIG. 3A through FIG. 3C are cross-sectional views showing fabrication steps of the solid state imaging device according to embodiment 1.

Then, at the step of FIG. 3A, the side walls 14 are removed by wet etching. The etching time is adjusted according to the width of the side walls 14 to completely remove the side walls 14.

Figure 3B:
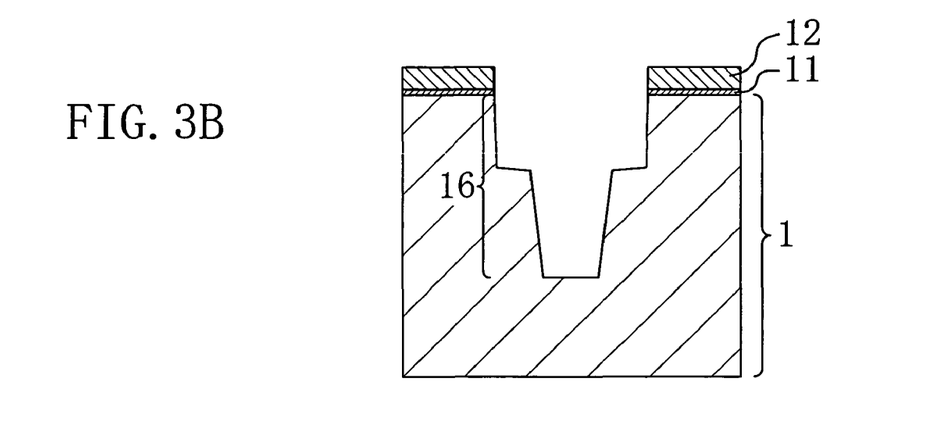

Then, at the step of FIG. 3B, the silicon substrate 1 is selectively etched using the anti-oxidization film 12 as a mask to form a stepped trench 16. It should be noted that the stepped trench 16 can have a larger number of steps by repeating the steps of FIG. 2C to FIG. 3B after the formation of the stepped trench 16. In this case, the local stress at the corner of each step can further be decreased. The ratio of the width of the stepped trench 16 at the bottom to the width of the stepped trench 16 at the top is preferably 0.7 or less.

Figure 3C:
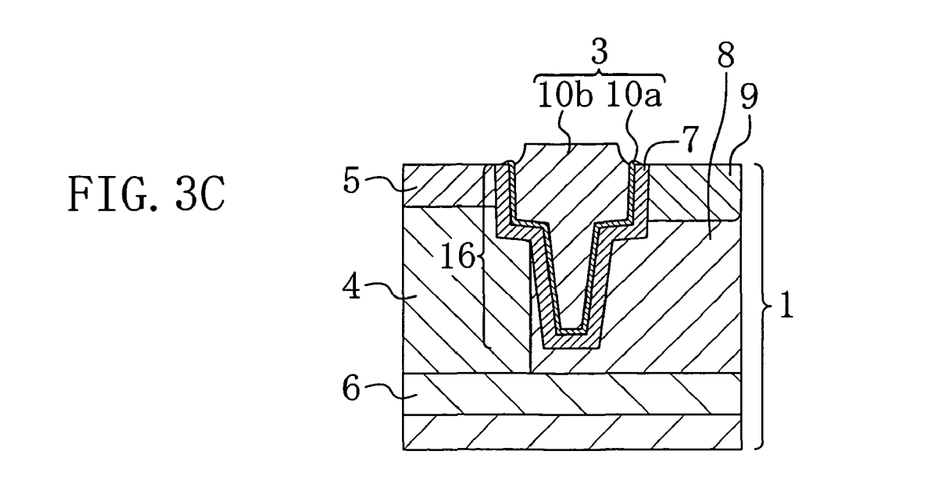

Then, a side wall oxide film 10a is formed by thermally oxidizing the side and bottom surfaces of the stepped trench 16, and then, boron as a P-type impurity is implanted into the inner surface of the stepped trench 16 with the implantation energy of 2.0 KeV to 50 KeV at the dose of $1\times10^{11}/cm^2$ to $1\times10^{15}/cm^2$, whereby the $P^+$ side wall layer 7 is formed in a portion of the silicon substrate 1 which extends along the side and bottom surfaces of the stepped trench 16. Then, an insulating film 10b is formed of an oxide film by CVD to fill the stepped trench 16. Thereafter, the anti-oxidization film 12 and the pad insulating film 11 are partially removed by CMP or dry etching, and the remaining part of the anti-oxidization film 12 and the pad insulating film 11 is removed by wet etching. Thereafter, an N-type silicon layer 4, a $P^+$ surface layer 5, a $P^-$ silicon layer 6, a P-type silicon layer 8 and an active region 9 are formed in desired regions by ion implantation. As a result, the structure shown in FIG. 3C is obtained.

Subsequently, although not shown, gate insulating films, gate wirings, interlayer insulating films, signal lines, pulse transmission lines, etc., are formed according to a well-known method. Through the above steps, the semiconductor device of embodiment 1 is fabricated.

In embodiment 1, the side wall of the device isolation region 3 has a stepped shape, which mainly provides two advantages. The first one is that, in a region neighboring the lower part of the device isolation region 3, the P+ side wall layer 7 does not much extend toward the region of the N-type silicon layer 4 as compared with the conventional example because the width of the device isolation region 3 is smaller in the lower part. With this structure, a larger area can be secured for the N-type silicon layer 4 as compared with the conventional example. That is, in embodiment 1, the lower part of the device isolation region 3 is narrow such that the N-type silicon layer 4 has a sufficient width, whereas in the conventional devices, as the cell size decreases, the N-type silicon layer 4 is greatly diminished due to thermal diffusion of the P+ impurity during the formation of the P+ side wall layer 7. In the structure of embodiment 1, the amount of accumulable charges can be increased even when the cell size is small because the N-type silicon layer functions as a charge accumulation layer.

The second advantage is that the bottom edge of the device isolation region 3 is located away from the N-type silicon layer 4. At this bottom edge, a large tensile stress locally occurs in the silicon substrate 1, and therefore, unnecessary charges which would cause noise are likely to be generated. However, the bottom edge is located spatially away from the N-type silicon layer 4 with an electric barrier provided therebetween, whereby noise is reduced.

The ratio of the width of the stepped trench 16 at the bottom to the width of the stepped trench 16 at the top is preferably 0.7 or less. In this case, the number of saturated electrons accumulable in the photodiode 2, which is in correlation with the dynamic range characteristics, is increased as compared with the conventional example.

In embodiment 1, when thermally oxidizing the side wall of the stepped trench 16 to form the side wall oxide film 10a, a bird's beak is formed at the upper edge of the stepped trench 16. This structure suppresses occurrence of a leakage current in this region and decreases the hump characteristics.

The present inventor observed about 10,000 white blemishes per 1,000,000 pixels in a conventional solid state imaging device wherein the STI is used as the device isolation. On the other hand, we observed 300 white blemishes or less per 1,000,000 pixels in the solid state imaging device of embodiment 1. It should be noted that the white blemishes were measured in pixels whose output is 10 mV or more in the absence of impinging light.

Embodiment 2

Hereinafter, a solid state imaging device and a fabrication method thereof according to embodiment 2 of the present invention are described with reference to the drawings.

Figure 4:
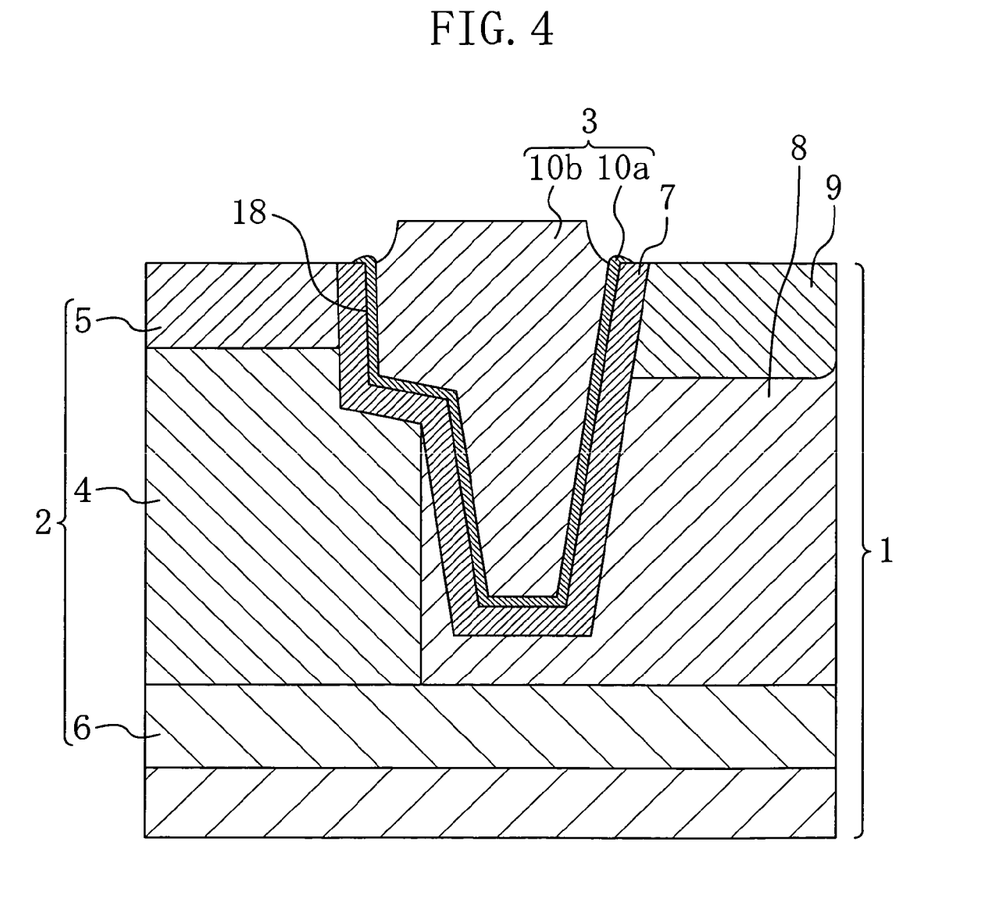
FIG. 4 is a cross-sectional view showing a structure of a solid state imaging device according to embodiment 2 of the present invention.

FIG. 4 is a cross-sectional view showing a structure of a solid state imaging device according to embodiment 2 of the present invention. It should be noted that wirings and interlayer films formed in the layered structure over a silicon substrate 1 are not shown. According to embodiment 2, as shown in FIG. 4, a photodiode (photoelectric conversion region) 2 has a P+NP− structure in the upper part of the silicon substrate 1. Specifically, the P+NP− structure includes a thin P+ surface layer 5 provided at the uppermost level of the silicon substrate 1, an N-type silicon layer (charge accumulation region) 4 provided under the P+ surface layer 5, and a P− silicon layer 6 provided under the N-type silicon layer 4.

When light impinging on the photodiode 2 reaches a PN junction interface between the N-type silicon layer 4 and the P+ surface layer 5 or P− silicon layer 6, the light is photoelectrically converted to holes and electrons. Thus, signal charges (electrons) are accumulated in a depletion layer region between the N-type silicon layer 4 and the P+ surface layer 5 and a depletion layer region between the N-type silicon layer 4 and the P− silicon layer 6 according to the amount of the impinging light. With the P+ surface layer 5 provided at the uppermost level, charges which are generated due to random noise in the surface of the photodiode 2 are reduced.

The side of the photodiode 2 is at least partially covered by the device isolation region 3. One of the side surfaces of the device isolation region 3 which is on the side of the photodiode 2 has a stepped shape. With this stepped shape, the width of the device isolation region 3 changes ungradually from its upper part to its lower part. Due to this stepped side surface, the width of the device isolation region 3 becomes smaller in a downward direction. The device isolation region 3 has a side wall oxide film 10a which is formed by thermally oxidizing the surface of a trench 18 and an insulating film 10b which is provided over the side wall oxide film 10a to fill the trench 18. The device isolation region 3 electrically separates the photodiode 2 from an active region (source and drain regions) 9 of a MOS transistor which is used for reading accumulated charges. Specific examples of this MOS transistor are the MOS transistors 22, 23, 24 and 25 of FIG. 8.

In the structure shown in FIG. 4, a portion of the silicon substrate 1 which covers the side and bottom surfaces of the device isolation region 3 is a P+ side wall layer 7. The P+ side wall layer 7 is in contact with the side surface of the N-type silicon layer (charge accumulation region) 4. The P+ side wall layer 7 electrically connects the P+ surface layer 5 and a P-type silicon layer 8. The P+ side wall layer 7 prevents unnecessary charges generated in the vicinity of the interface between the P+ side wall layer 7 and the device isolation region 3 (which would cause noise) from flowing into the N-type silicon layer 4.

Next, a method for fabricating a solid state imaging device according to embodiment 2 is described with reference to the drawings. FIG. 5A through FIG. 5D and FIG. 6A through FIG. 6C are cross-sectional views showing fabrication steps of the solid state imaging device according to embodiment 2.

Figure 5A:
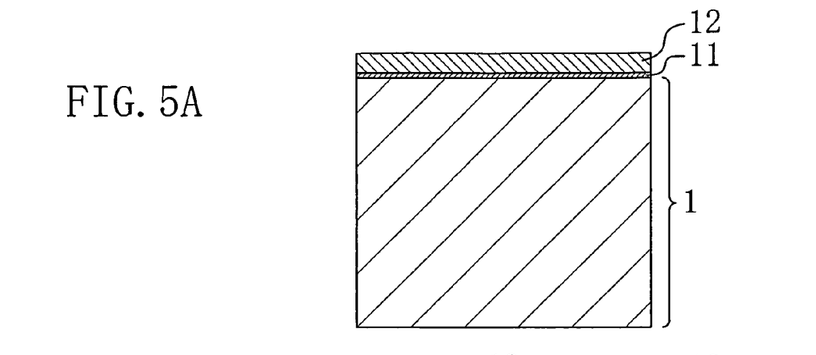
FIG. 5A through FIG. 5D are cross-sectional views showing fabrication steps of the solid state imaging device according to embodiment 2.
Figure 5B:
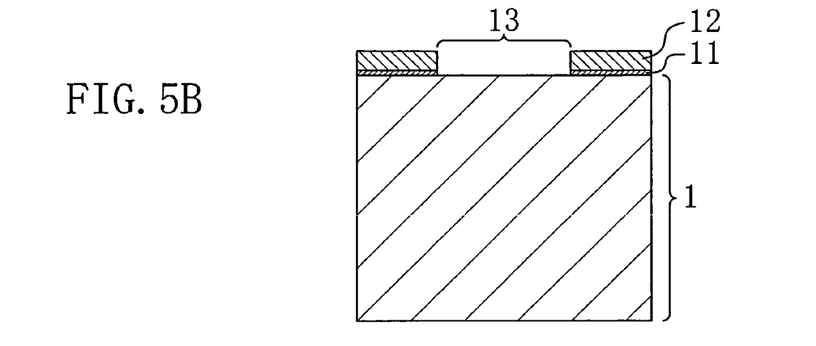
Figure 5C:
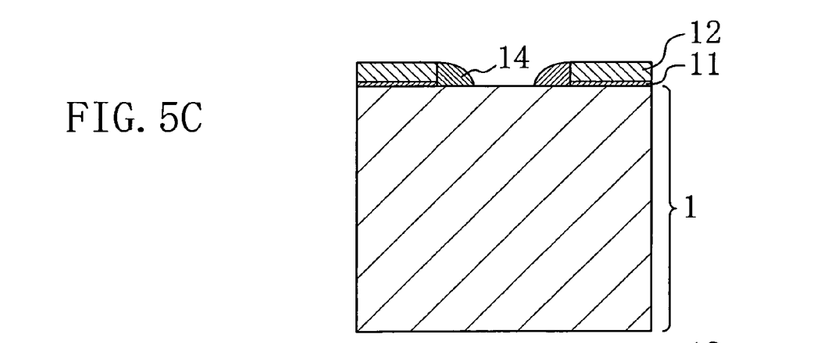

In the fabrication method of embodiment 2, first, the steps of FIG. 5A through FIG. 5C are carried out in the same way as described in embodiment 1.

Figure 5D:
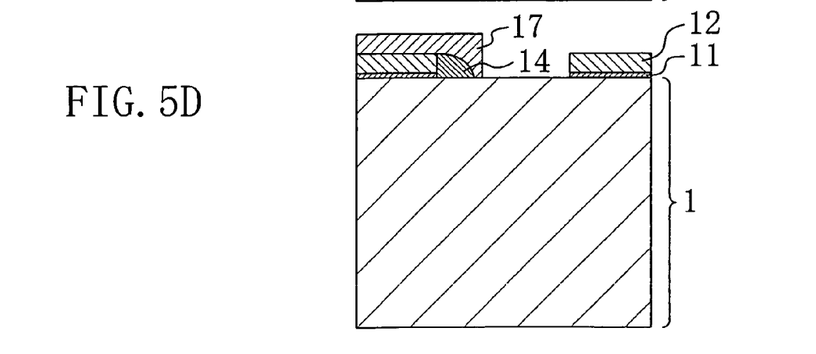

Then, at the step of FIG. 5D, only one of the side walls 14 provided at the both sides of the opening 13, which is closer to the photodiode 2 than the other side wall 14, is lithographically covered with a resist layer 17 while the other side wall 14 is exposed. Then, etching is carried out using a hydrofluoric acid solution to remove the exposed side wall 14 (which is closer to a region which is to be the active region 9).

Figure 6A:
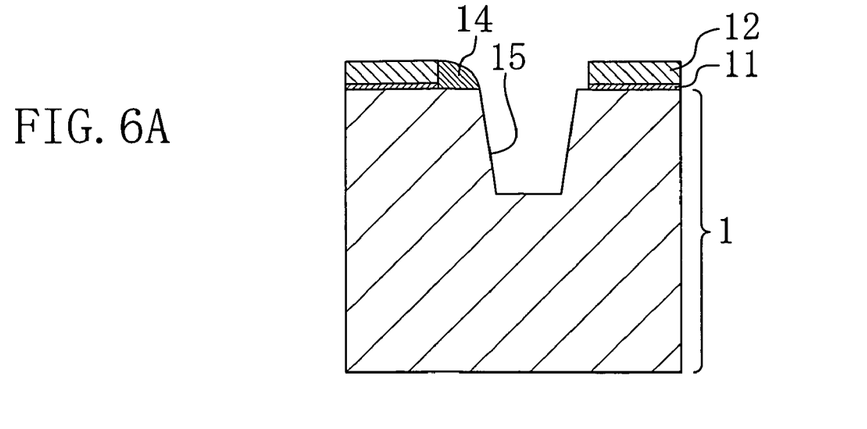
FIG. 6A through FIG. 6C are cross-sectional views showing fabrication steps of the solid state imaging device according to embodiment 2.

Then, at the step of FIG. 6A, the silicon substrate 1 is selectively removed by etching to form a trench 15. The depth of the trench 15 is 10 nm to 400 nm.

Figure 6B:
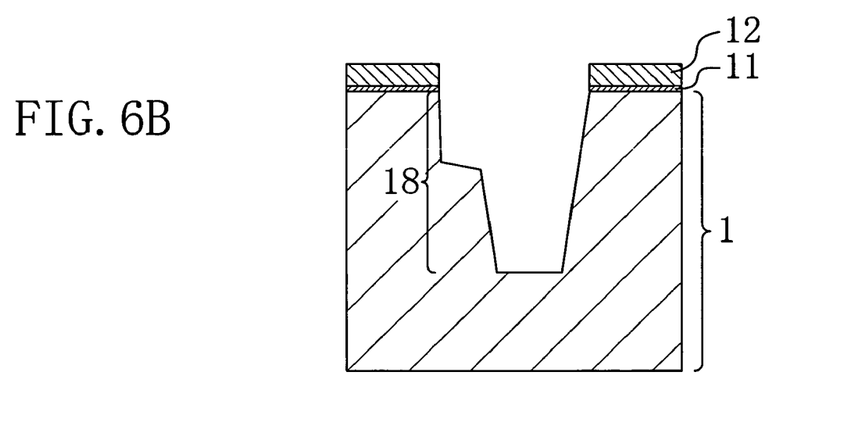

Then, at the step of FIG. 6B, the side wall 14 closer to the photodiode 2 is removed, and the silicon substrate 1 is selectively removed by etching to form a trench 18.

Figure 6C:
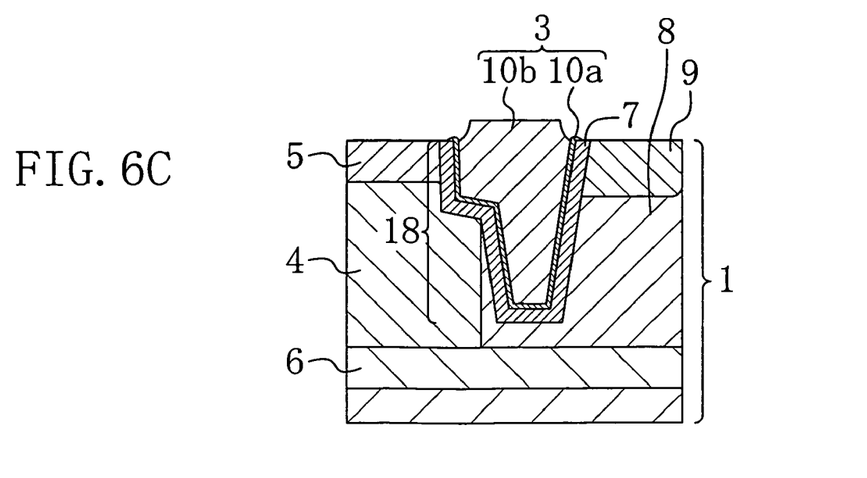

Then, a side wall oxide film 10a is formed by thermally oxidizing the side and bottom surfaces of the trench 18, and then, boron as a P-type impurity is implanted into the inner surface of the trench 18 with the implantation energy of 2.0 KeV to 50 KeV at the dose of $1\times10^{11}/cm^2$ to $1\times10^{15}/cm^2$, whereby the P+ side wall layer 7 is formed in a portion of the silicon substrate 1 which extends along the side and bottom surfaces of the trench 18. Then, an oxide film 10b is formed by CVD to fill the trench 18. Thereafter, an anti-oxidization film 12 and a pad insulating film 11 are partially removed by CMP or dry etching, and the remaining part of the anti-oxidization film 12 and the pad insulating film 11 is removed by wet etching. Thereafter, an N-type silicon layer 4, a P+ surface layer 5, a P⁻ silicon layer 6, a P-type silicon layer 8 and an active region 9 are formed in desired regions by ion implantation. As a result, the structure shown in FIG. 6C is obtained.

Subsequently, although not shown, gate insulating films, gate wirings, interlayer insulating films, signal lines, pulse transmission lines, etc., are formed according to a well-known method. Through the above steps, the semiconductor device of embodiment 2 is fabricated.

Figure 7:
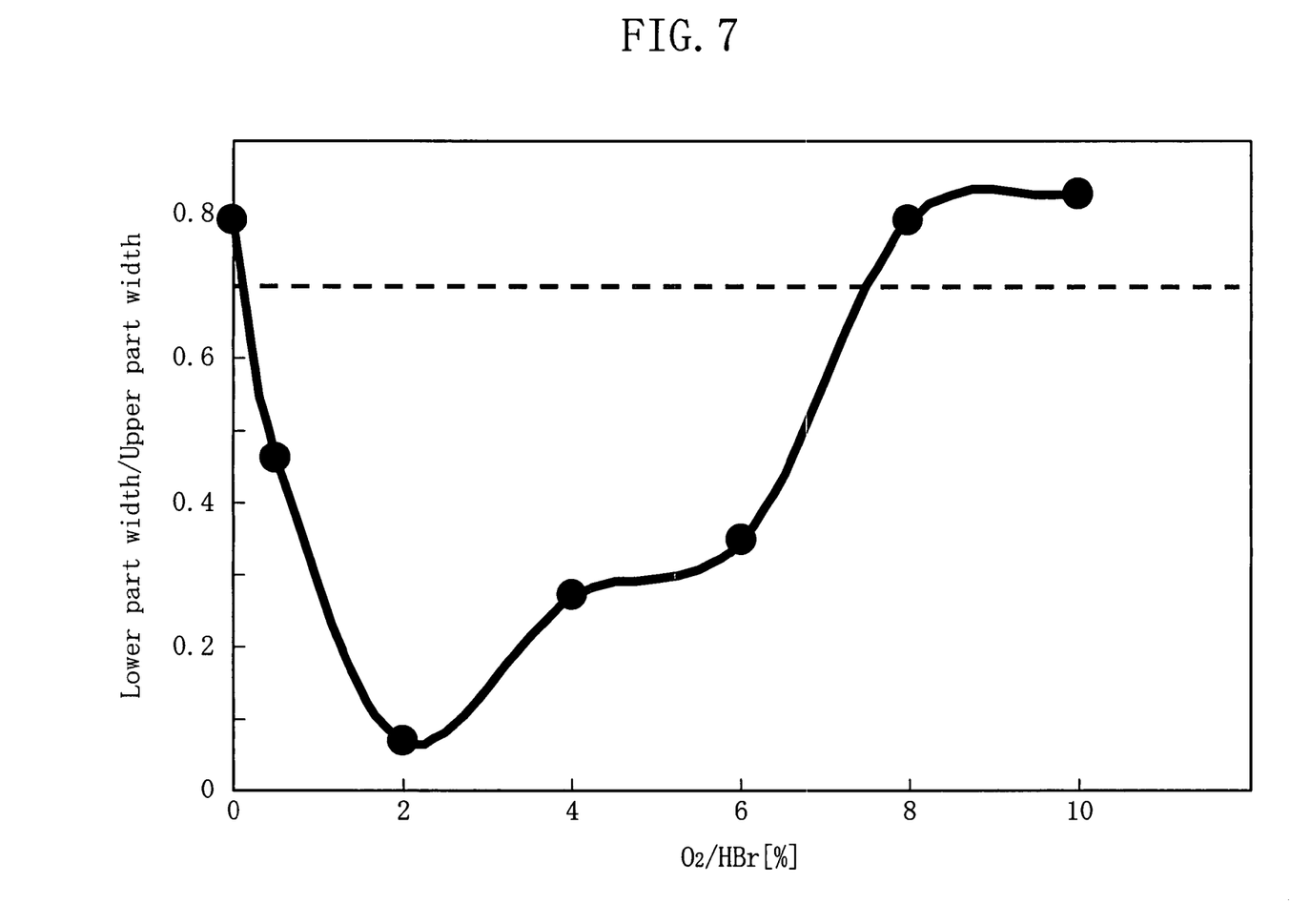
FIG. 7 is a graph showing a variation in the ratio between the width of an isolation trench in the upper part and the width of the isolation trench in the lower part which is seen when the ratio between hydrogen bromide gas and oxygen gas in an etching gas is changed.

In embodiments 1 and 2, the side walls 14 are used such that the ratio of the width of the device isolation region 3 in its lower part to the width of the device isolation region 3 in its upper part is 0.7 or less. However, according to the present invention, the width of the device isolation region 3 in its lower part may be formed smaller than the width at the upper part by appropriately adjusting the etching conditions. FIG. 7 is a graph showing a variation in the ratio between the width of an isolation trench in the upper part and the width of the isolation trench in the lower part which is seen when the ratio between hydrogen bromide gas and oxygen gas in an etching gas is changed. As shown from FIG. 7, when the proportion (the ratio of the flow rate) of the oxygen gas in the hydrogen bromide gas is in the range of 0.2% to 7.3%, the ratio of the width of the trench in the lower part to the width at the upper part is 0.7 or less. However, when etching is carries out using an etching gas of such a gas ratio, the device isolation of the present invention can be formed without using the side walls 14. It should be noted that, in this case, the shape of the device isolation trench is not a stepped shape but a tapered shape which becomes gradually narrower in a direction toward the bottom of the trench 18. With this method, the solid state imaging device of the present invention can be fabricated with a low process cost.

Embodiment 2 mainly provides two advantages. The first one is that, in a region neighboring the lower part of the device isolation region 3, the P⁺ side wall layer 7 does not much extend toward the region of the N-type silicon layer 4 as compared with the conventional example because the width of the device isolation region 3 is smaller in the lower part. With this structure, a larger area can be secured for the N-type silicon layer 4 as compared with the conventional example. That is, in embodiment 2, the lower part of the device isolation region 3 is narrow such that the N-type silicon layer 4 has a sufficient width, whereas in the conventional devices, as the cell size decreases, the N-type silicon layer 4 is greatly diminished due to thermal diffusion of the P⁺ impurity during the formation of the P⁺ side wall layer 7. In the structure of embodiment 2, the amount of accumulable charges can be increased even when the cell size is small because the N-type silicon layer functions as a charge accumulation layer.

The second advantage is that the bottom edge of the device isolation region 3 is located away from the N-type silicon layer 4. At this bottom edge, a large tensile stress locally occurs in the silicon substrate 1, and therefore, unnecessary charges which would cause noise are likely to be generated. However, the bottom edge is located spatially away from the N-type silicon layer 4 with an electric barrier provided therebetween, whereby noise is reduced.

The ratio of the width of the trench 18 at the bottom to the width of the trench 18 at the top is preferably 0.7 or less. In this case, the number of saturated electrons accumulable in the photodiode 2, which is in correlation with the dynamic range characteristics, is increased as compared with the conventional example.

In embodiment 2, when thermally oxidizing the side wall of the trench 18 to form the side wall oxide film 10a, a bird's beak is formed at the upper edge of the trench 18. This structure suppresses occurrence of a leakage current in this region and decreases the hump characteristics.

In embodiment 2, a side surface of the device isolation region 3 which is in contact with the active region 9 preferably has a smooth slope such that the width of the device isolation region 3 gradually decreases toward the bottom of the trench 18. In this case, a portion of the device isolation region 3 which is in contact with the active region 9 has no step, so that a depletion region formed by the active region 9 and the P-type silicon layer 8 does not include an edge. Therefore, the increase of the leakage current in the active region 9 is suppressed.

The present inventor observed about 10,000 white blemishes per 1,000,000 pixels in a conventional solid state imaging device wherein the STI is used as the device isolation. On the other band, we observed 300 white blemishes or less per 1,000,000 pixels in the solid state imaging device of embodiment 2. It should be noted that the white blemishes were measured in pixels whose output is 10 mV or more in the absence of impinging light.

The solid state imaging devices of embodiments 1 and 2 are useful for use in cameras.

What is claimed is:

1. A solid state imaging device, comprising:
   an imaging region provided in an upper part of a silicon substrate, the imaging region including a photoelectric conversion region, said photoelectric conversion region including an upper layer, a middle layer and a lower layer;
   a device isolation at least partially surrounding the photoelectric conversion region, where the device isolation has a stepped shape including an upper part and lower part, and a width of the device isolation is smaller in the lower part than in the upper part and ungradually changes from the upper part to the lower part;
   a side wall layer covering a side and bottom surfaces of the device isolation and electrically connecting the upper layer and the middle layer; and
   a MOS transistor provided in the imaging region, the MOS transistor being electrically separated from the photoelectric conversion region by the device isolation, wherein
   a bottom surface of the upper layer is formed above a bottom edge of the upper part of the device isolation,
   the middle layer of the photoelectric conversion region is formed directly below at least a part of the bottom surfaces of the upper part of the device isolation, and
   the middle layer of the photoelectric conversion region is not formed directly below the bottom surface of the lower part of the device isolation.

2. The solid state imaging device of claim 1, wherein a side surface of the device isolation which is closer to the photoelectric conversion region has a step such that the width of the device isolation ungradually changes.

3. The solid state imaging device of claim 2, wherein a side surface of the device isolation which is closer to the MOS transistor has no step.

4. The solid state imaging device of claim 1, wherein a side surface of the device isolation which is opposite to the photoelectric conversion region is a smooth slope.

5. The solid state imaging device of claim 4, wherein the side surface of the device isolation, which is opposite to the photoelectric conversion region, is in contact with an active region of the MOS transistor.

6. The solid state imaging device of claim 1, wherein the ratio of the width of the device isolation at its top to the width of the device isolation at its bottom is in the range of 0 to 0.7.

7. The solid state imaging device of claim 1, wherein:
the device isolation has a structure where a trench provided in the silicon substrate is filled with an insulating film; and
a portion of the silicon substrate which surrounds the device isolation contains an impurity whose conductivity type is opposite to that of source and drain regions of the MOS transistor.

8. The solid state imaging device of claim 7, wherein a silicon oxide film formed by thermal oxidation is provided between the trench and the insulating film.

9. A camera including the solid state imaging device of claim 1.

* * * * *